United States Patent [19]

Kim

[11] Patent Number: 5,488,585

[45] Date of Patent: Jan. 30, 1996

[54] CIRCUIT FOR GENERATING COLUMN DECODER ENABLE SIGNAL IN A SEMICONDUCTOR DEVICE

[75] Inventor: Hong S. Kim, Kyungki-do, Rep. of Korea

[73] Assignee: Hyundai Electronics Industries Co., Inc., Rep. of Korea

[21] Appl. No.: 294,085

[22] Filed: Aug. 22, 1994

[30] Foreign Application Priority Data

Aug. 20, 1994 [KR] Rep. of Korea ............... 1993-16245

[51] Int. Cl.$^6$ .................................. G11C 7/02
[52] U.S. Cl. .............. 365/210; 365/205; 365/230.06
[58] Field of Search .................................. 365/205, 210, 365/230.06

[56] References Cited

U.S. PATENT DOCUMENTS 5,245,584  9/1993  Zampaglione et al. ............... 365/210

Primary Examiner—David C. Nelms
Assistant Examiner—F. Niranjan
Attorney, Agent, or Firm—Merchant, Gould, Smith, Edell, Welter & Schmidt

[57] ABSTRACT

A circuit for generating a column decoder enable signal in a semiconductor device, capable of transmitting data on bit lines toward data bus lines at an optimum point in time, even when the fabrication process, the supply voltage, and the temperature used are varied. The circuit includes true and complementary dummy bit lines constructed in a normal cell array, each of the dummy bit lines including dummy cells, and a dummy bit line sensing amplifier connected to the true and complementary dummy bit lines and adapted to generate a column decoder enable signal using data from the true and complementary dummy bit lines.

5 Claims, 5 Drawing Sheets

CIRCUIT FOR GENERATING COLUMN DECODER ENABLE SIGNAL IN A SEMICONDUCTOR DEVICE

BACKGROUND OF THE INVENTION

1. Field of the Invention

The present invention relates to a circuit for generating a column decoder enable signal in a semiconductor device such as a dynamic random access memory (DRAM), and more particularly, to such a circuit capable of transmitting data on bit lines toward data bus lines at an optimum point time.

2. Description of the Prior Art

For leading data stored in a cell array of a DRAM, generally, one of word lines in a selected cell array block is first enabled by an input row address signal. Data stored in cells enabled by the word line are then sensed and amplified by bit line sensing amplifiers, respectively, one of the sensed and amplified bit line data is then transmitted to a data bus line of a next stage by a column address signal. In order to transmit the bit line data to the data bus line after the bit line data are sufficiently sensed and amplified in the bit line sensing amplifiers in the above process, it is required to provide a column decoder enable signal enabled at an optimum point in time.

For obtaining a period for sensing and amplifying the bit line data by the sensing amplifiers, conventional methods for enabling column decoders use a circuit modeled by resistance elements, capacitance elements and inverter chains. By such a circuit, the point in time when the column decoder enable signal is enabled is determined. In this case, the modeled circuit involves a time delay that varies depending on the fabrication process, the supply voltage, and the temperature used. Due to such variations in delay time, it is difficult to enable the column decoder enable signal at an optimum point in time in the conventional column decoder enable signal generating circuit. Now, the process of reading data stored in a cell array block by the conventional column decoder enable signal generating circuit will be described, in conjunction with FIG. 1 and FIGS. 2A to 2F.

FIG. 1 is a circuit diagram of a semiconductor memory device, illustrating the process of reading data stored in a cell array block by the conventional column decoder enable signal generating circuit. FIGS. 2A to 2F are timing diagrams of signals generated from various parts of the circuit shown in FIG. 1, respectively.

A spare row enable bar signal generating circuit 12, shown in FIG. 1, receives a row address strobe bar signal /RAS, shown in FIG. 2A, via a row address strobe buffer 11. The spare row enable bar signal generating circuit 12 also receives a row address decoding signal via a decoding signal input stage (not shown). The spare row enable bar signal generating circuit 12 performs a logic combination of the received signals and generates a spare row enable bar signal /SRE having a low logic value as shown in FIG. 2B.

The spare row enable bar signal /SRE is delayed for a predetermined time in a sensing generating enable bar signal generating circuit 13, which includes a word line simulator 14, in order to obtain a timing margin. The sensing generating enable bar signal generating circuit 13 generates a low-logic sensing generating enable bar signal /SG having the form of the spare row enable signal /SRE delayed for the predetermined time, as shown in FIG. 2C. As the sensing generating enable bar signal /SG is inverted into the low logic state, a bit line sensing amplifier array 18, which has been pre-charged with a voltage (Vcc/2) corresponding to half of the supply voltage Vcc by a sensing enable signal /S and a restore enable signal RTO as shown in FIG. 2D, receives the ground voltage GND and the supply voltage Vcc respectively by the sensing enable signal /S and the restore enable signal RTO. As a result, the bit line sensing amplifier array 18 is activated. At the activated state, the bit line sensing amplifier array 18 senses and amplifies true and complementary data on true and complementary bit lines BL and /BL. After a sufficient time to sense and amplify the true and complementary data on the true and complementary bit lines BL and /BL elapses, MOS transistors M11 and M12 are turned on so as to transmit the sensed and amplified true and complementary data to true and complementary data lines DB and /DB, respectively.

For optimizing the turn-on time of the MOS transistors M11 and M12, a chip selector bar signal generating circuit 15 is used which is constituted by inverters and capacitors. An inverter chain is also used. The chip selector enable bar signal generating circuit 15 delays the output signal /SG of the spare row enable bar signal generating circuit 13 for a predetermined time and thereby generates a chip selector bar signal /CS shown in FIG. 2E. The inverter chain inverts and delays the chip selector enable bar signal /CS output from the chip selector bar signal generating circuit 15, thereby generating a global column enable signal YGo having a high logic value, as shown in FIG. 2F. The global column enable signal YGo from the inverter chain is applied to a column decoder array 19. In response to the global column enable signal YGo, the column decoder array 19 transmits a column address decoding signal AYi to gates of the MOS transistors M11 and M12 for a period of time during which the high-logic global column enable signal YGo is applied.

However, a semiconductor device including the conventional column decoder enable signal generating circuit involves the following problems.

First, the data access time is increased because the delay time is estimated depending on simulation of the sensing generating enable bar signal /SG and the chip selector bar signal /CS for a timing of the sensing time for transmitting the bit line data to the data bus line.

Second, the delay time is continuously varied depending on the fabrication process, the supply voltage and the temperature used because the semiconductor device employs inverters and capacitance elements so as to delay the sensing generating enable bar signal /CS and the chip selector enable bar signal /SG for a predetermined time.

Third, where an appropriate delay time is to be obtained, the circuit should be corrected using a mask because the signal delay is accomplished using inverters and capacitors.

SUMMARY OF THE INVENTION

Therefore, an object of the invention is to provide a circuit for generating a column decoder enable signal in a semiconductor device, capable of transmitting data on bit lines toward data bus lines at an optimum point in time, even when the fabrication process, the supply voltage, and the temperature used are varied.

In accordance with the present invention, this object can be accomplished by providing a circuit for generating a column decoder enable signal in a semiconductor device, comprising: true and complementary dummy bit lines constructed in a normal cell array, each of the dummy bit lines including dummy cells; and a dummy bit line sensing amplifier connected to the true and complementary dummy bit lines and adapted to generate a column decoder enable signal using data from the true and complementary dummy bit lines.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
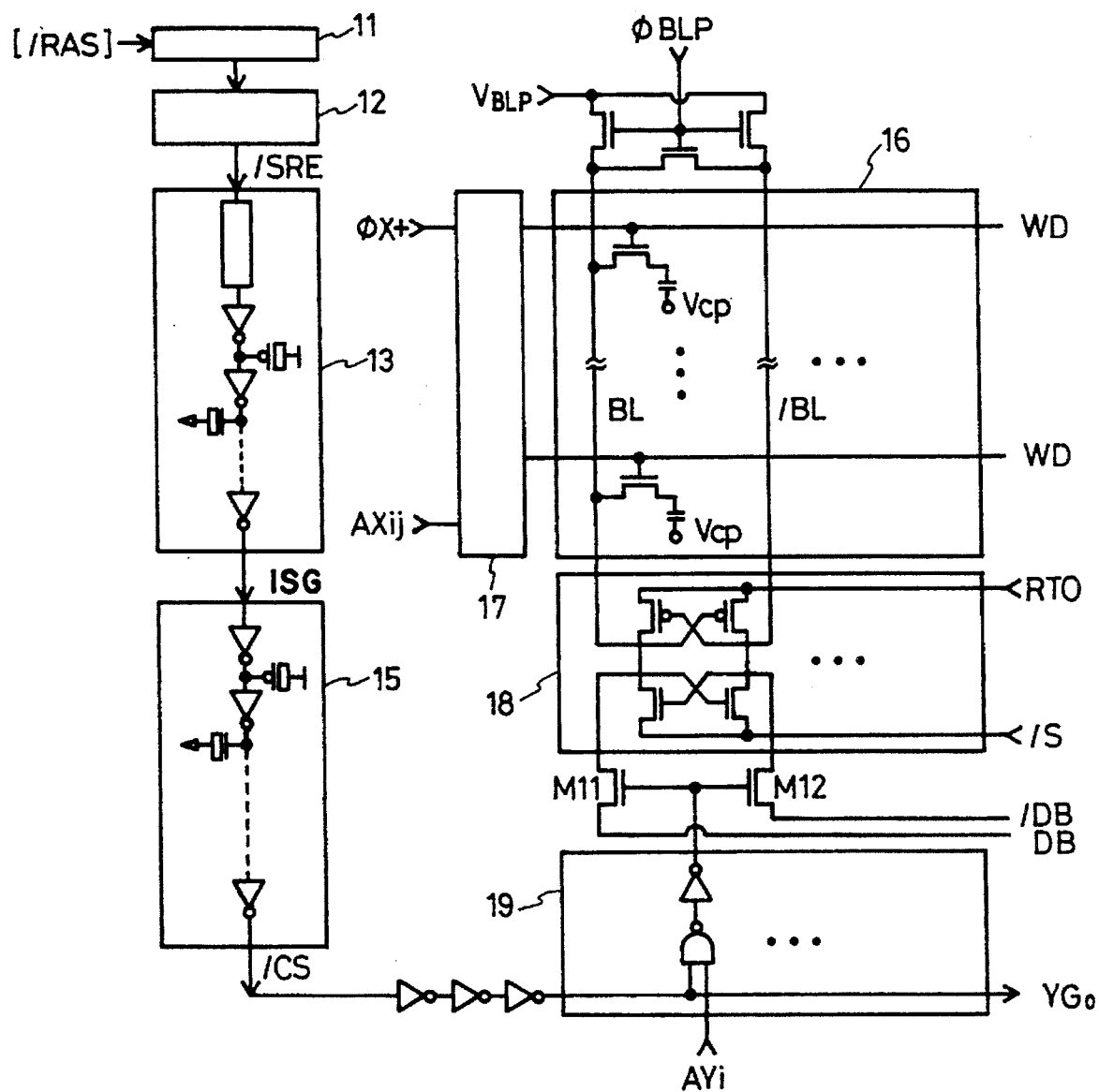
FIG. 1 is a circuit diagram of a semiconductor device including a conventional column decoding enable signal generating circuit.
Figures 2A, 2B, 2C, 2D, 2E, 2F:
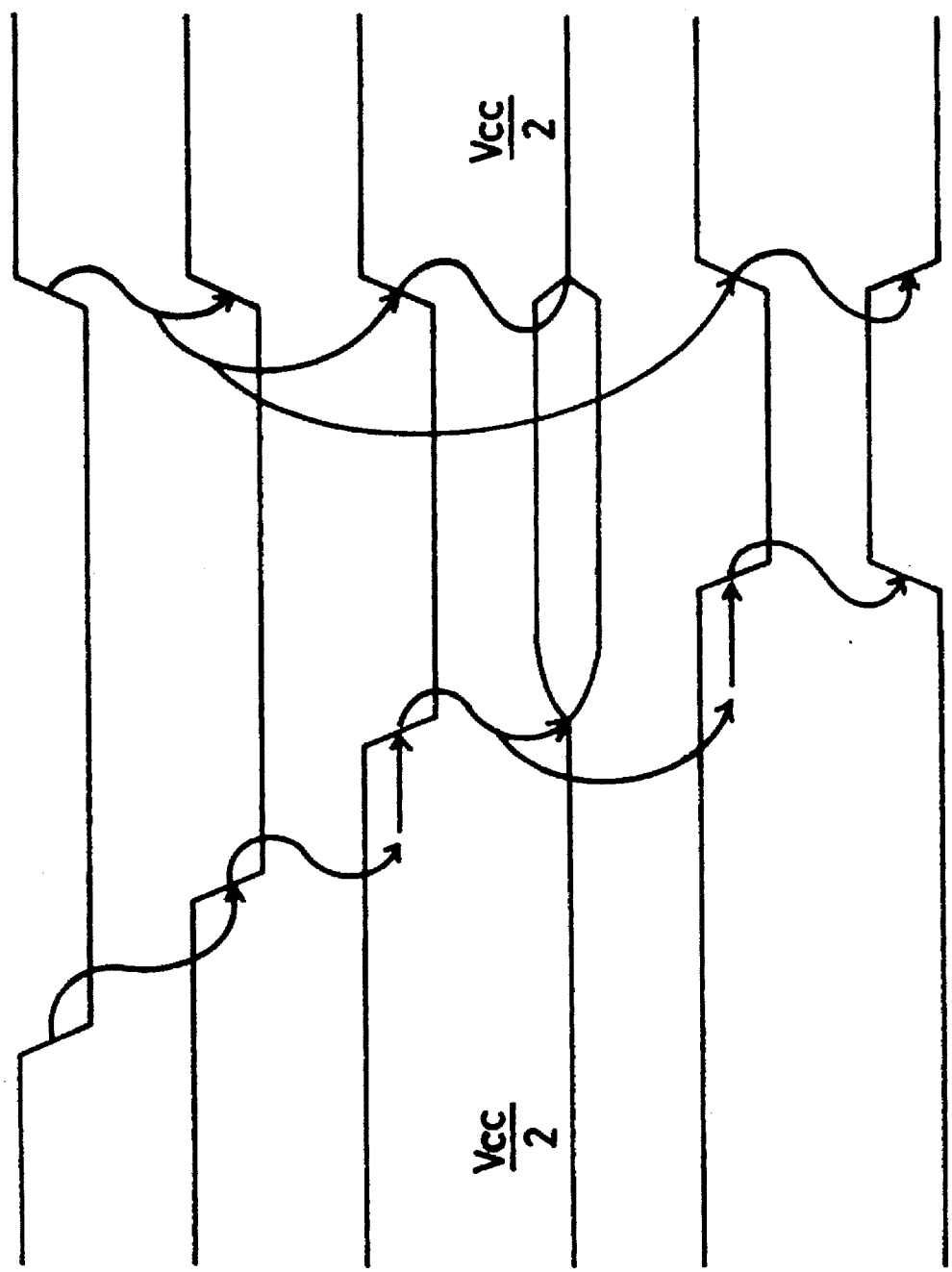
FIGS. 2A to 2F are timing diagrams of signals generated from various parts of the circuit shown in FIG. 1, respectively.
Figure 3:
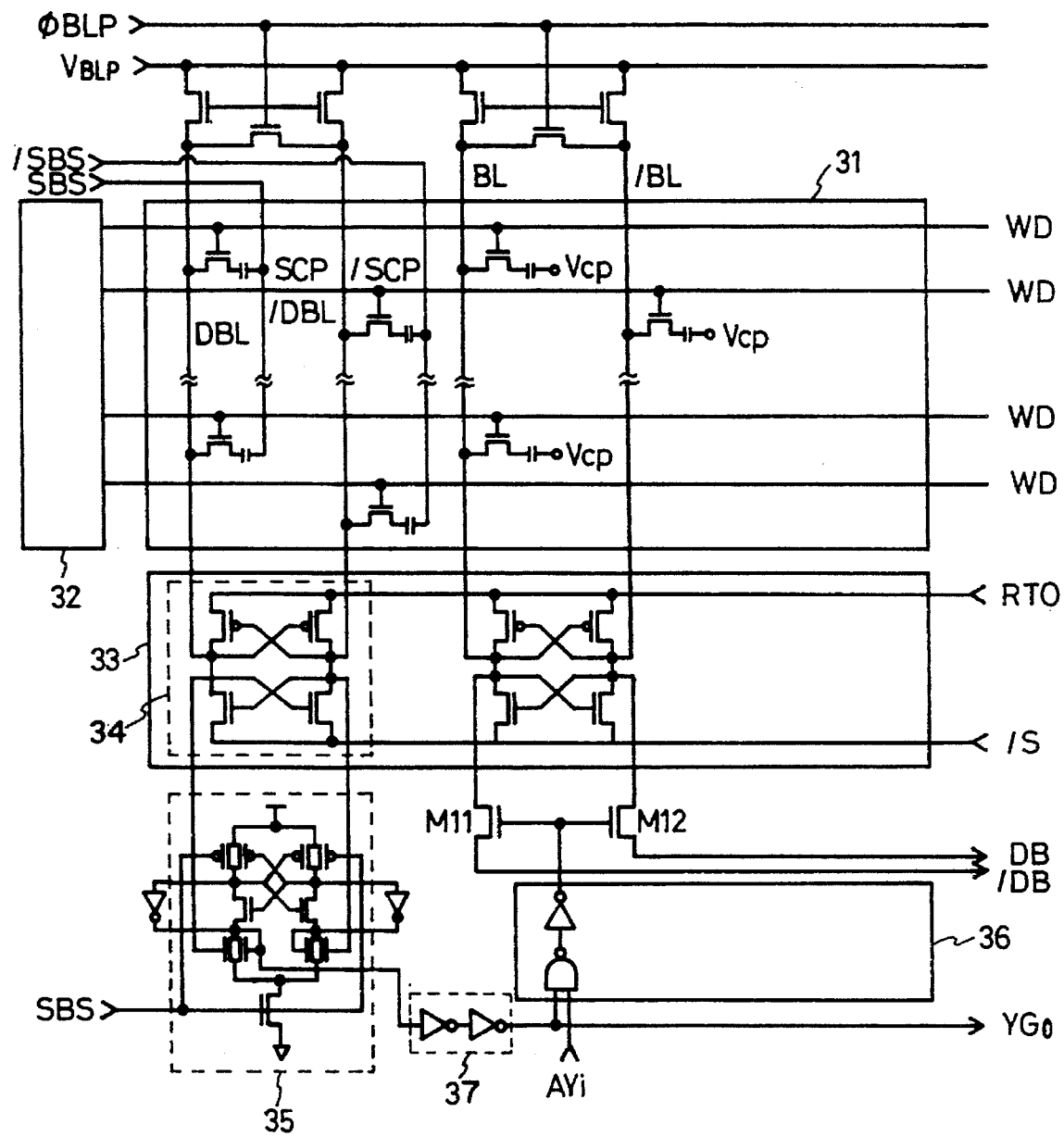
FIG. 3 is a circuit diagram of a semiconductor device including a column decoder enable signal generating circuit in accordance with an embodiment of the present invention.

FIG. 3 is a circuit diagram of a semiconductor memory device, illustrating the process of leading data stored in a cell array block by a column decoder enable signal generating circuit in accordance with an embodiment of the present invention. FIGS. 4A to 4G are timing diagrams of signals generated from various parts of the circuit shown in FIG. 3, respectively.

Figure 4:
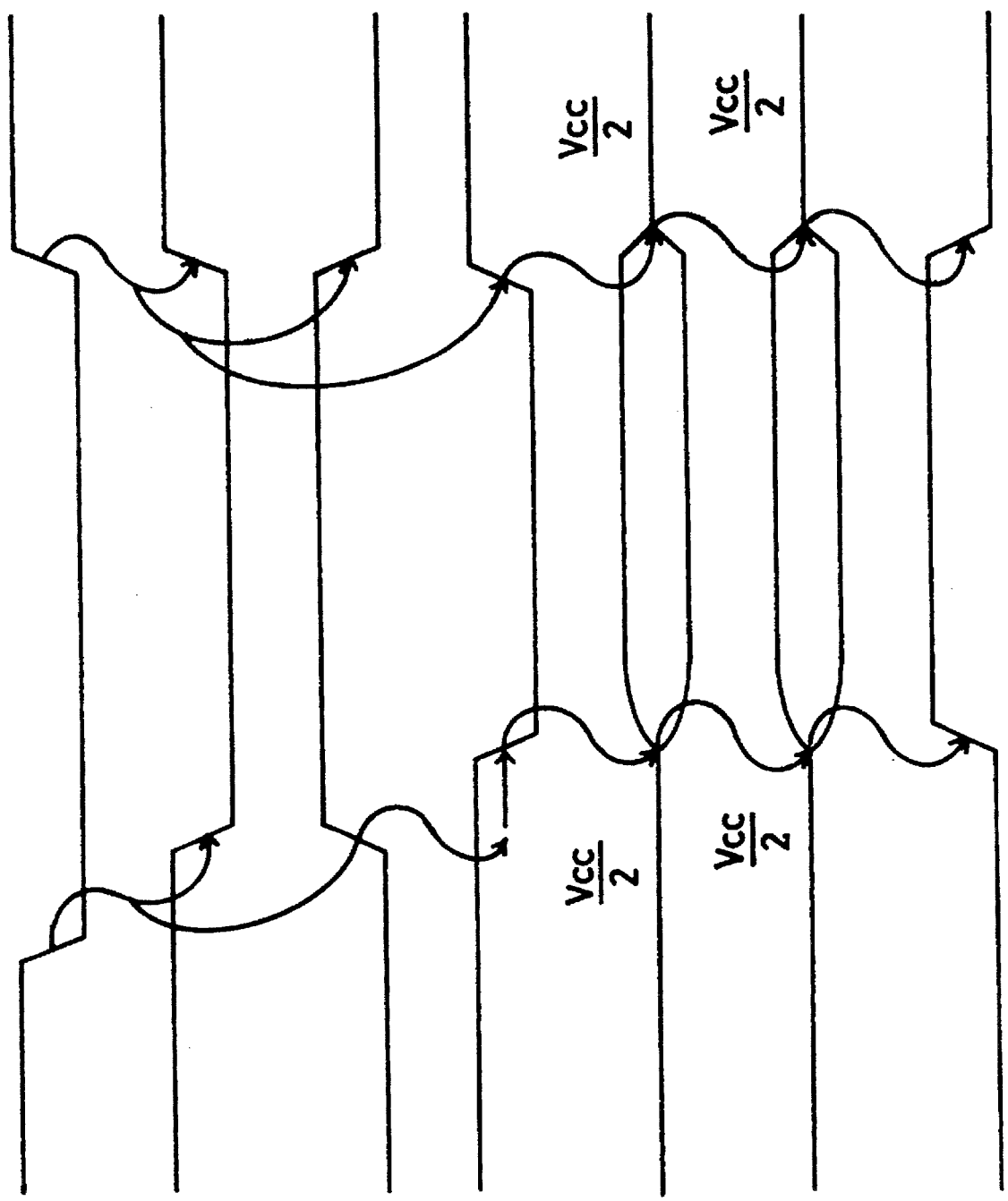
FIGS. 4A to 4G are timing diagrams of signals generated from various parts of the circuit shown in FIG. 3, respectively.

When a row address strobe signal /RAS, as shown in FIG. 4A, is enabled at its low logic level, a spare row enable bar signal /SRE has a low logic level, as shown in FIG. 4B. When the spare row enable bar signal /SRE has the low logic level, a sensing block selection signal SBS, as shown in FIG. 4C is enabled at its high logic value. Also, a sensing generating enable bar signal /SG is enabled at its low logic level, as shown in FIG. 4D. A sensing block selection bar signal /SBS, which has an inverted logic value to the sensing block selection signal SBS is also enabled at its low logic value.

As both the sensing block selection signal SBS and the sensing block selection bar signal /SBS are enabled, a true separate cell plate SCP is inverted into a high logic state, while a complementary separate cell plate /SCP is inverted into a low logic state. At this time, dummy cells connected between the true separate cell plate SCP and a true dummy bit line DBL are precharged to have a voltage corresponding to a high logic value. On the other hand, dummy cells connected between the complementary separate cell plate /SCP and a complementary dummy bit line /DBL are precharged to have a voltage corresponding to a low logic value. Where a word line WD connected to a cell array block 31 including the dummy cells is enabled at its high logic state, a voltage dV is generated on the true dummy bit line DBL, The voltage dV is expressed by the following equation:

$$dV \approx \frac{(C_{cell} \times Vcc) \times (Vcc/2 \times C_{DBL})}{C_{cell} + C_{DBL}}$$

where, $C_{cell}$ represents a capacity of capacitors included in the dummy cell, Vcc/2 the voltage pie-charged in represents a dummy bit line DBL, and $C_{DBL}$ represents a capacity of the dummy bit line DBL.

The level of the voltage dV is sensed and amplified by a first sensing amplifier 34. This voltage value is substantially the same as a voltage sensed and amplified by normal bit line sensing amplifiers included in a sensing amplifier array 33. The sensing amplifier array 33, including the first sensing amplifier 34, receives the low-logic sensing enable bar signal /S and the high-logic restore enable signal RTO, both of which are represented in FIG. 4E. The voltage dV is amplified to the level of the supply voltage Vcc by a second sensing amplifier 35. The second sensing amplifier 35 is activated for a period of time during which the true block selection signal SBS is maintained at its high logic level.

The amplified voltage dV has a waveform shown in FIG. 4G. The voltage dV is applied to a column decoder array 36 via an inverter chain 37, constituted by two inverters, in the form of a high-logic column decoding enable signal YGo. A response to the received high-logic column decoding enable signal YGo, the column decoder array 36 transmits a column address decoding signal AYi to the gates of MOS transistors M11 and M12. In response to the column address decoding signal AYi applied from the column decoder array 36, the MOS transistors M11 and M12 transmit data on a true normal bit line BL and a complementary normal bit line /BL to a true data line DB and a complementary data line /DB, respectively.

The dummy cells are arranged at one end of the normal cell array so as to receive a word line boot strapping voltage later than the normal cell that receives the word line boot strapping voltage last. The dummy cells allow the sensing amplifiers connected to the dummy bit line to sense and amplify data later than the sensing amplifiers connected to the normal bit line, thereby ensuring a transmission of data from the normal bit line to the data bus at an optimum point in time.

The column decoder enable signal YGo is enabled at a point in time slightly later than the point in time when the true and complementary data on the true and complementary normal bit lines BL and /BL output from the latest-activated normal cell is sensed and amplified by the normal sensing amplifier. This is ensured by the sensing and amplifying operation of the second sensing amplifier 35.

The second sensing amplifier 35 includes a latch circuit which serves to maintain the column decoder enable signal YGi at its high logic state when a row address is selected in a fast page mode, while a column address is toggled. In order to pre-charge data in the dummy cells connected to the true and complementary dummy bit lines DBL and /DBL, the true and complementary separate cell plates SCP and /SCP here a function to charge-couple the dummy cells.

As apparent from the above description, the semiconductor device shown in FIG. 3 can transmit data on the normal bit line to the data bus at an optimum point in time, irrespective of variations in fabrication process, supply voltage, and temperature, by sensing and amplifying data output from the dummy cells by the first and second sensing amplifiers. By virtue of such an effect, the semiconductor device obtains an advantage of minimizing the data access time.

Figure 5:
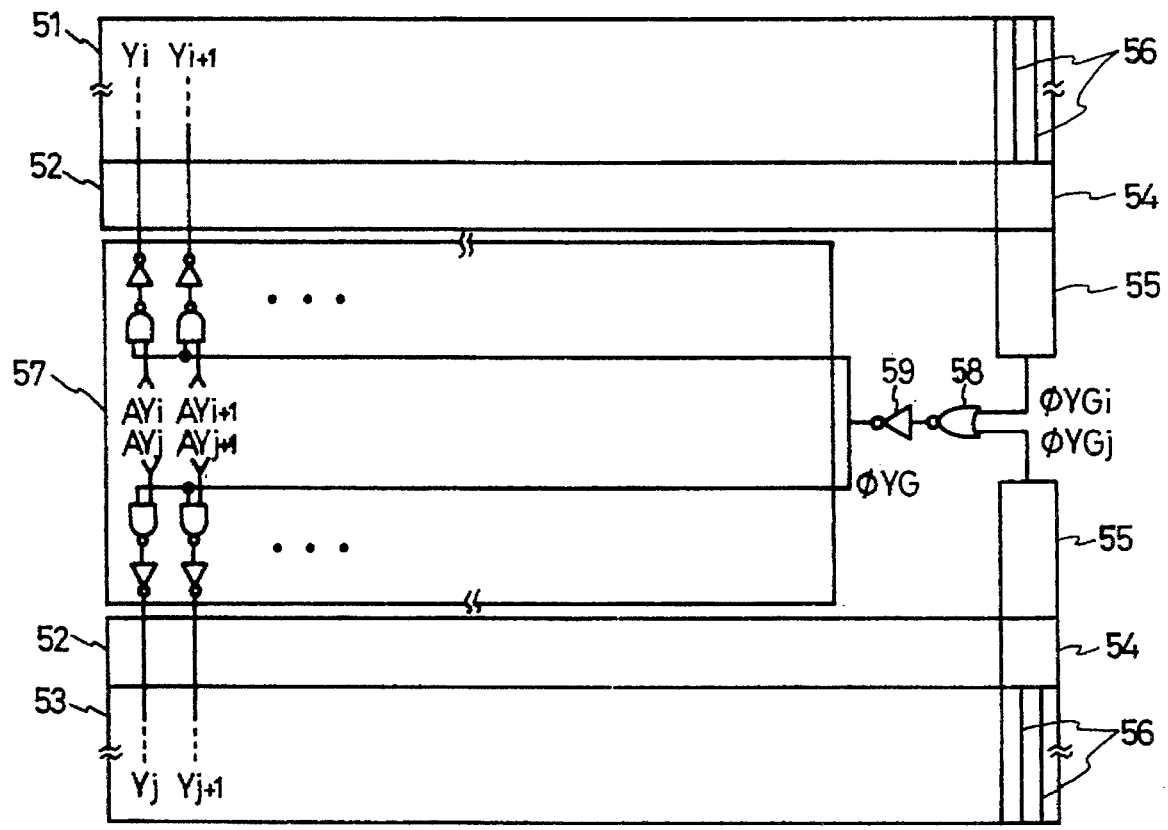
FIG. 5 is a circuit diagram of a semiconductor device including a column decoder enable signal generating circuit in accordance with another embodiment of the present invention.

FIG. 5 is a circuit diagram illustrating a semiconductor device including a column decoder enable signal generating circuit in accordance with another embodiment of the present invention. Where no column decoder enable signal is generated due to a defect of a dummy cell included in the semiconductor device of FIG. 3, the semiconductor device of FIG. 5 prevents a cell array block including the defective dummy cell from performing poorly To this end, the semiconductor device of FIG. 5 is constructed for ORing global column decoder enable signals øYGi and øYGj generated from corresponding cell array blocks by an OR gate and applying the resultant signal from the OR gate to a column decoder array 57 as a column decoder enable signal øYG. By use of the column decoder enable signal øYG generated by the OR-operation, the semiconductor device performs a normal read operation even when a minor defect is generated at cells included in the cell array blocks 51 and 53.

In the calve of FIG. 5, the semiconductor device includes a pair of dummy bit lines 56 and a pair of sensing amplifiers 54 and 55, all of which have the same constructions as those of FIG. 3, respectively. However, the second sensing amplifier 55 does not apply the global column decoder enable signals øYGi and øYGj directly to the column decoder array, but applies them to the OR gate 58. The OR gate 58 applies the result obtained by ORing the global column decoder enable signals øYGi and øYGj to the column decoder array 57. As a result, the semiconductor device can perform a normal read-out operation even when some dummy cells do not operate due to variations in fabrication process or occurrence of soft errors.

As apparent from the above description, the present invention provides a circuit for generating a column decoder enable signal in a semiconductor device, including an addition of dummy cells to a normal cell array, thereby capable of generating a column decoder enable signal by data output from the dummy cells and thereby transmitting data on a bit line toward a data bus at an optimum point in time, irrespective of variation in fabrication process, supply voltage, and temperature.

Although the preferred embodiments of the invention have been disclosed for illustrative purposes, those skilled in the art will appreciate that various modifications, additions, and substitutions are possible, without departing from the scope and spirit of the invention as disclosed in the accompanying claims.

What is claimed is:

1. A circuit for generating a column decoder enable signal in a semiconductor device, comprising:

true and complementary dummy bit lines constructed in a normal cell array, each of the dummy bit lines including dummy cells; and a dummy bit line sensing amplifier connected to the true and complementary dummy bit lines and adapted to generate a column decoder enable signal using data from the true and complementary dummy bit lines.

2. A circuit in accordance with claim 1, wherein the dummy cells on the true dummy bit line have a high logic value, while the dummy cells on the complementary dummy bit line have a low logic value.

3. A circuit in accordance with claim 1, further comprising: a separate cell plate adapted to charge-couple the dummy cells of the dummy bit lines so as to record data in the dummy cells.

4. A circuit in accordance with claim 1, further comprising:

a second normal cell array having the true and complementary dummy bit lines;

a second dummy bit line sensing amplifier adapted to generate a column decoder enable signal using data from the true and complementary dummy bit lines; and logic operating means adapted to logically operate outputs from the dummy bit line sensing amplifiers and thereby generate a global decoder enable signal.

5. A circuit in accordance with claim 1, further comprising:

a second sensing amplifier adapted to amplify and latch the column decoder enable signal from the dummy bit line sensing amplifier and thereby maintain the column decoder enable signal at its enable state in a fast page mode.

* * * * *

UNITED STATES PATENT AND TRADEMARK OFFICE
CERTIFICATE OF CORRECTION

PATENT NO. : 5,488,585

DATED : January 30, 1996

INVENTOR(S) : Hong S. Kim

It is certified that error appears in the above-identified patent and that said Letters Patent is hereby corrected as shown below:

```
     Column 1, line 12, insert --in-- after "point"
     Column 1, line 16, replace "word the" with --the word--
     Column 1, line 19, replace "respectively, one" with
--respectively . One --
     Column 1, line 30, insert --,-- after "elements"
     Column 2, line 44, insert --,-- after "voltage"
     Column 3, line 34, replace "leading" with --reading--
     Column 3, line 50, insert --,-- after "SBS"
     Column 4, line 6,7, replace "the voltage pie-charged in
represents a" with --represents a voltage pre-charged in the--
     Column 4, line 24, replace "A" with --In--
     Column 4, line 58, replace "here" with --have--
     Column 5, line 18, replace "calve" with --case--
     Column 5, line 38, replace "variation" with --variations--
```

Signed and Sealed this

Twentieth Day of August, 1996

*Attest:*

BRUCE LEHMAN

*Attesting Officer*  *Commissioner of Patents and Trademarks*